(12) United States Patent
Miyamoto et al.

(10) Patent No.: US 8,193,048 B2
(45) Date of Patent: Jun. 5, 2012

(54) SEMICONDUCTOR DEVICE AND METHOD OF MANUFACTURING A SEMICONDUCTOR DEVICE

(75) Inventors: Masato Miyamoto, Kawasaki (JP); Masanori Terahara, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 288 days.

(21) Appl. No.: 12/061,367

(22) Filed: Apr. 2, 2008

(65) Prior Publication Data

US 2008/0237784 A1 Oct. 2, 2008

(30) Foreign Application Priority Data

Apr. 2, 2007 (JP) .................................. 2007-96499

(51) Int. Cl.
*H01L 21/8238* (2006.01)

(52) U.S. Cl. .. 438/199; 438/216; 438/261; 257/E21.639

(58) Field of Classification Search .................. 438/199, 438/261, 288
See application file for complete search history.

(56) References Cited

U.S. PATENT DOCUMENTS

| 5,573,973 | A   | * | 11/1996 | Sethi et al. ..................... 438/386 |
| 6,069,086 | A   | * | 5/2000  | Nallan et al. ................... 438/706 |
| 6,238,996 | B1  | * | 5/2001  | Liu et al. ........................ 438/400 |
| 6,238,998 | B1  | * | 5/2001  | Leobandung ................. 438/404 |
| 6,277,756 | B1  | * | 8/2001  | Ohara et al. .................. 438/700 |
| 6,372,151 | B1  | * | 4/2002  | Shin et al. ........................ 216/67 |
| 6,437,400 | B2  | * | 8/2002  | Leobandung ................. 257/329 |
| 6,841,452 | B2  | * | 1/2005  | Tanaka .......................... 438/424 |
| 7,416,933 | B2  | * | 8/2008  | Weimer ......................... 438/199 |
| 2002/0076918 | A1 | * | 6/2002  | Han et al. ...................... 438/634 |
| 2005/0001252 | A1 | * | 1/2005  | Kim et al. ..................... 257/296 |
| 2006/0030096 | A1 | * | 2/2006  | Weimer ......................... 438/199 |
| 2008/0206943 | A1 | * | 8/2008  | Chen et al. .................... 438/229 |
| 2008/0206973 | A1 | * | 8/2008  | Johnson et al. ............... 438/585 |
| 2008/0242019 | A1 | * | 10/2008 | Yu .................................. 438/232 |
| 2008/0283935 | A1 | * | 11/2008 | Sridhar et al. ................ 257/390 |

FOREIGN PATENT DOCUMENTS

JP 63-316440 A 12/1988

* cited by examiner

*Primary Examiner* — Fernando L Toledo
(74) *Attorney, Agent, or Firm* — Westerman, Hattori, Daniels & Adrian, LLP (57) ABSTRACT

A semiconductor device formed in a semiconductor substrate wherein the semiconductor substrate has a trench for isolating elements from each other, the trench has unevenness at the bottom thereof, and an insulator is buried in the trench.

14 Claims, 14 Drawing Sheets

SEMICONDUCTOR DEVICE AND METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2007-96499, filed on Apr. 2, 2007, the entire content of which is incorporated herein by reference.

BACKGROUND

In a semiconductor device, a shallow trench isolation (STI) method of burying an insulator in a trench formed in a semiconductor substrate is generally used as a method of electrically isolating elements such as transistors, diodes, trench capacitors, or resistors provided over the semiconductor substrate.

The STI method is known to be capable of achieving a desired element withstand voltage. The STI method is described with reference to the drawings.

Figure 1A:
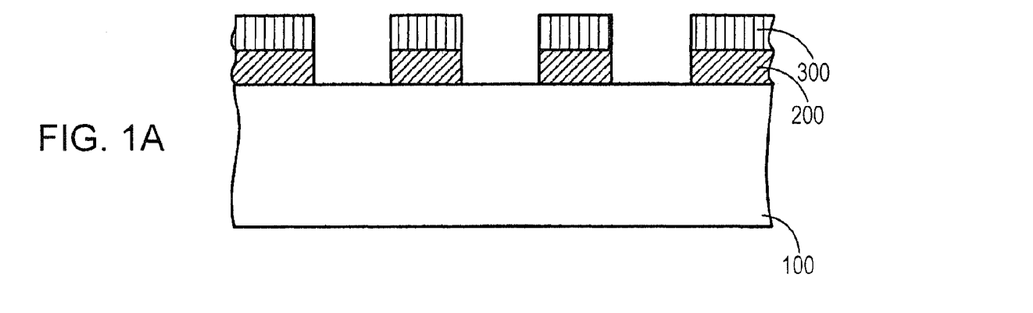
FIGS. 1A to 1F are sectional views showing a method of manufacturing a semiconductor device.

FIGS. 1A to 1F are schematic sectional views of a principal portion, illustrating a method of manufacturing a semiconductor device. As shown in FIG. 1A, a silicon oxide film 200 and a silicon nitride film 300 are formed over a semiconductor substrate 100 and then patterned.

Figure 1B:
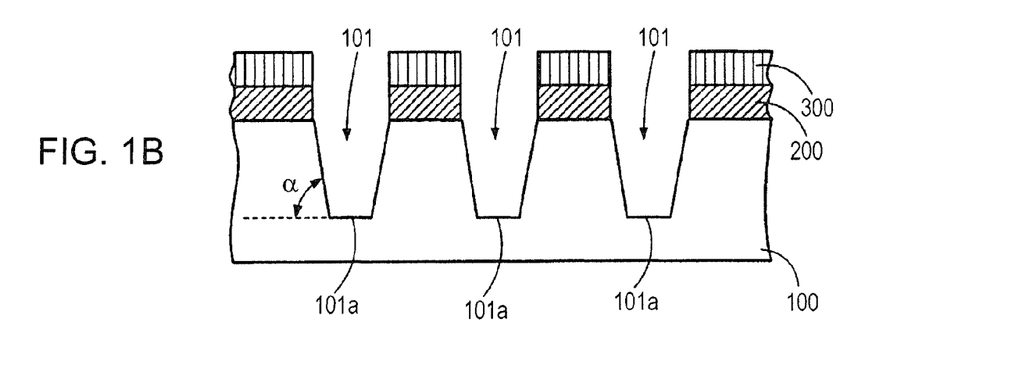

As shown in FIG. 1B, the semiconductor substrate 100 is etched using the silicon nitride film 300 as a mask to form trenches 101. Each of the trenches 101 has a flat bottom 101a.

The angle formed by the bottom and the side of each trench 101 is referred to as a "taper angle α".

Figure 1C:
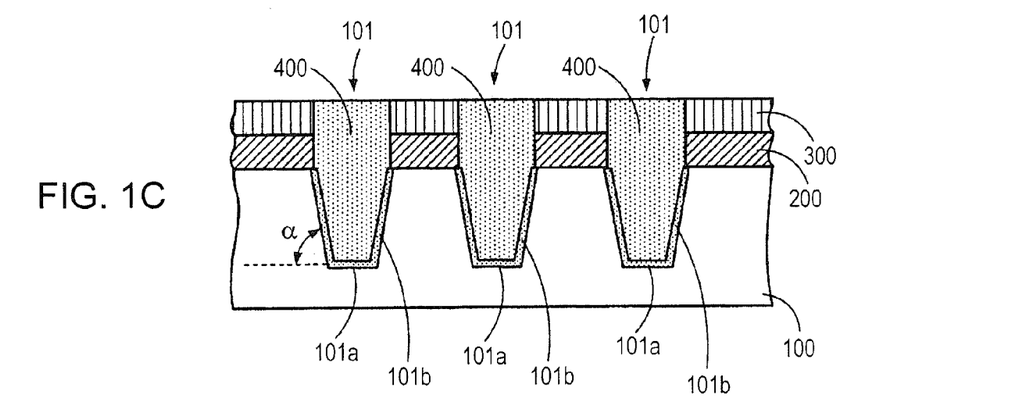

As shown in FIG. 1C, silicon oxide films 101b are formed over the inner walls of the trenches 101 by surface thermal oxidation. Then, oxide films 400 are formed in the trenches 101 by chemical vapor deposition (CVD) and polished by chemical mechanical polishing (CMP). The material of the oxide films 400 is a silicon oxide film.

Figure 1D:
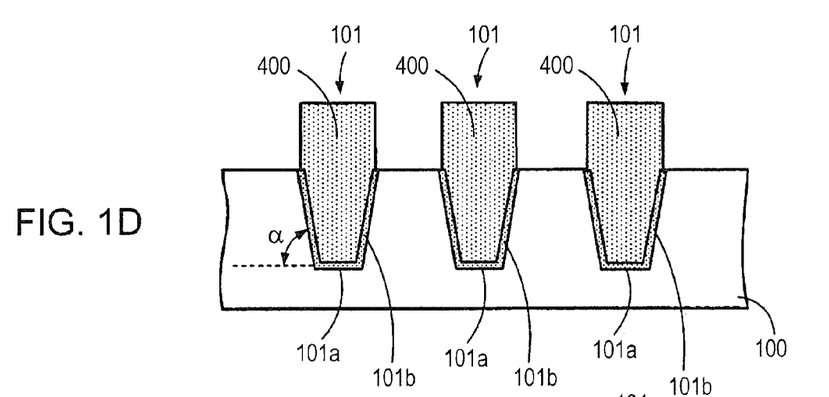

As shown in FIG. 1D, the silicon nitride film 300 and the silicon oxide film 200 are removed by chemical treatment or isotropic etching.

Figure 1E:
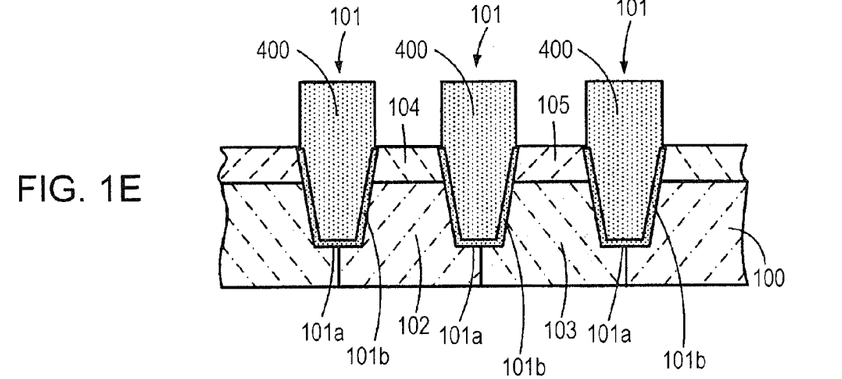

As shown in FIG. 1E, p-type metal oxide semiconductor (PMOS) regions 102 and n-type metal oxide semiconductor (NMOS) regions 103 are formed by well implantation. Further, channel regions 104 and 105 are formed by channel implantation.

Figure 1F:
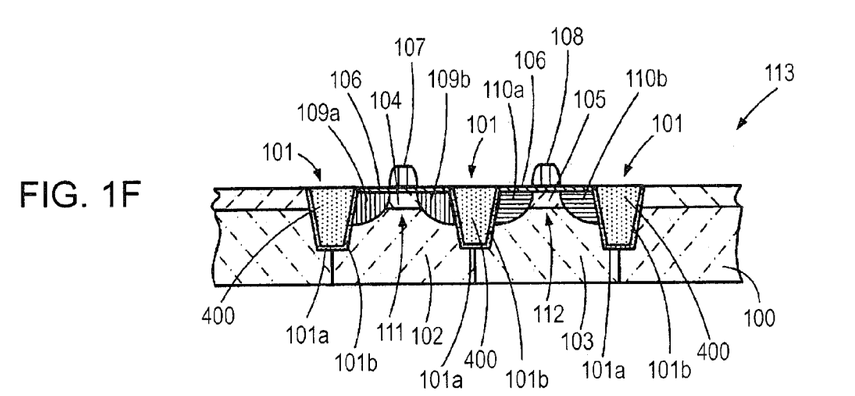

As shown in FIG. 1F, a gate oxide film 106 is formed over each of the PMOS regions 102 and the NMOS regions 103, and gate electrodes 107 and 108 are then formed. Further, source and drain regions 109a, 109b, 110a, and 110b are formed over the semiconductor substrate 100 to form MOS transistors 111 and 112.

When the trenches 101 are formed in the semiconductor substrate 100 by the STI method, a semiconductor device 113 having isolated element regions is manufactured. The trench width decreases with increasing in integration of a semiconductor device. Therefore, even when the trench width is narrowed, it is necessary to achieve sufficient element withstand voltage.

The term "element withstand voltage" represents a voltage difference between the source region 109b and drain region 110a when a specified current flows between the source and drain regions 109b and 110a with each trench 101 provided therebetween as shown in FIG. 1F. A semiconductor device preferably has a higher withstand voltage.

SUMMARY

According to an aspect of the invention, a semiconductor device has a trench formed in a semiconductor substrate with a first unevenness at the bottom thereof, and an insulator buried in the trench.

DESCRIPTION OF THE PREFERRED EMBODIMENTS

Figure 2:
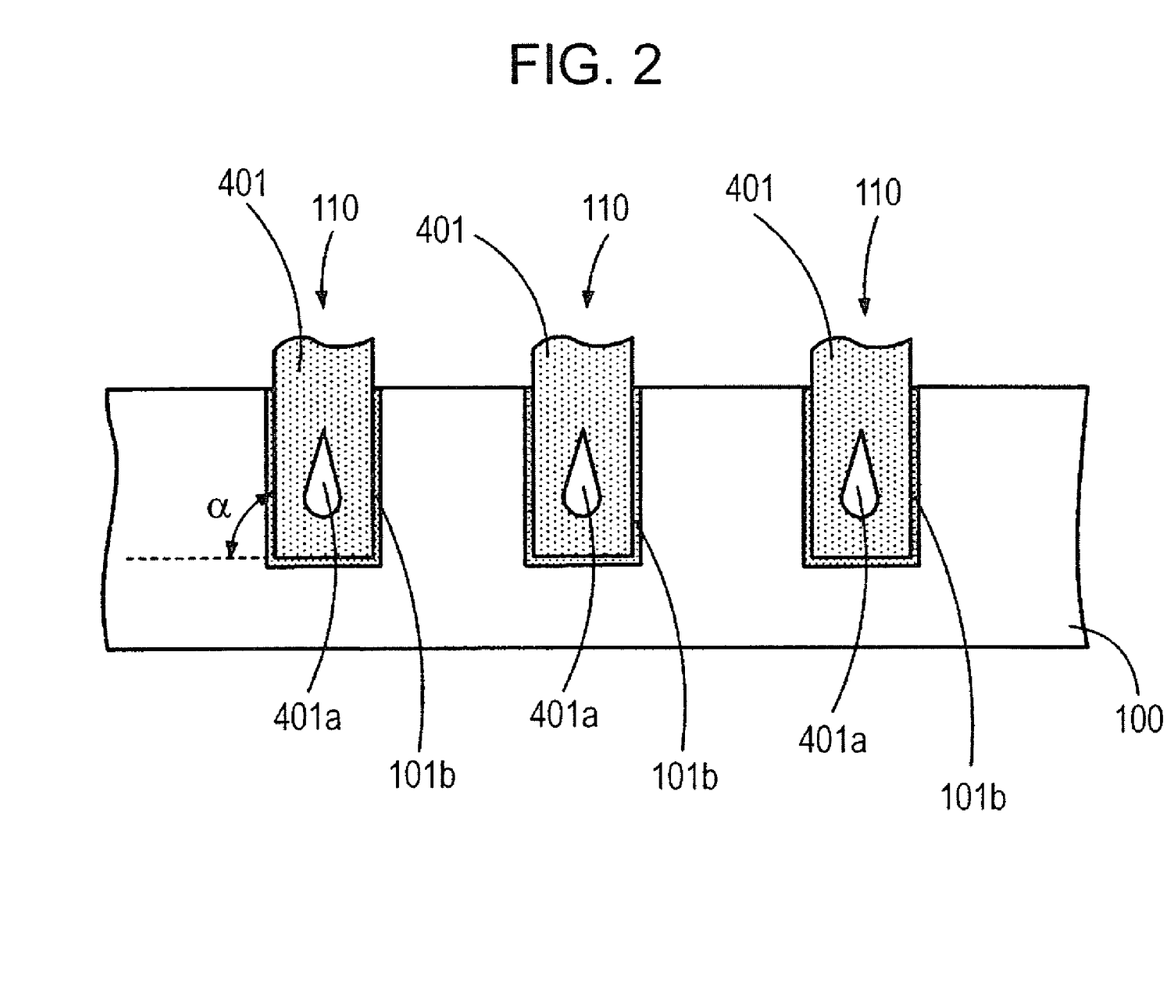
FIG. 2 is a sectional view showing a structure of an oxide film formed in a trench.

FIG. 2 is a schematic sectional view of a principal portion, illustrating a structure of an oxide film formed in a trench by a CVD method.

In a trench 110 having a taper angle α near 90 degrees, a void 401a may occur in the trench 110. Therefore, from the viewpoint of avoiding the void, the taper angle α is preferably an acute angle, not a right angle.

Figure 3:
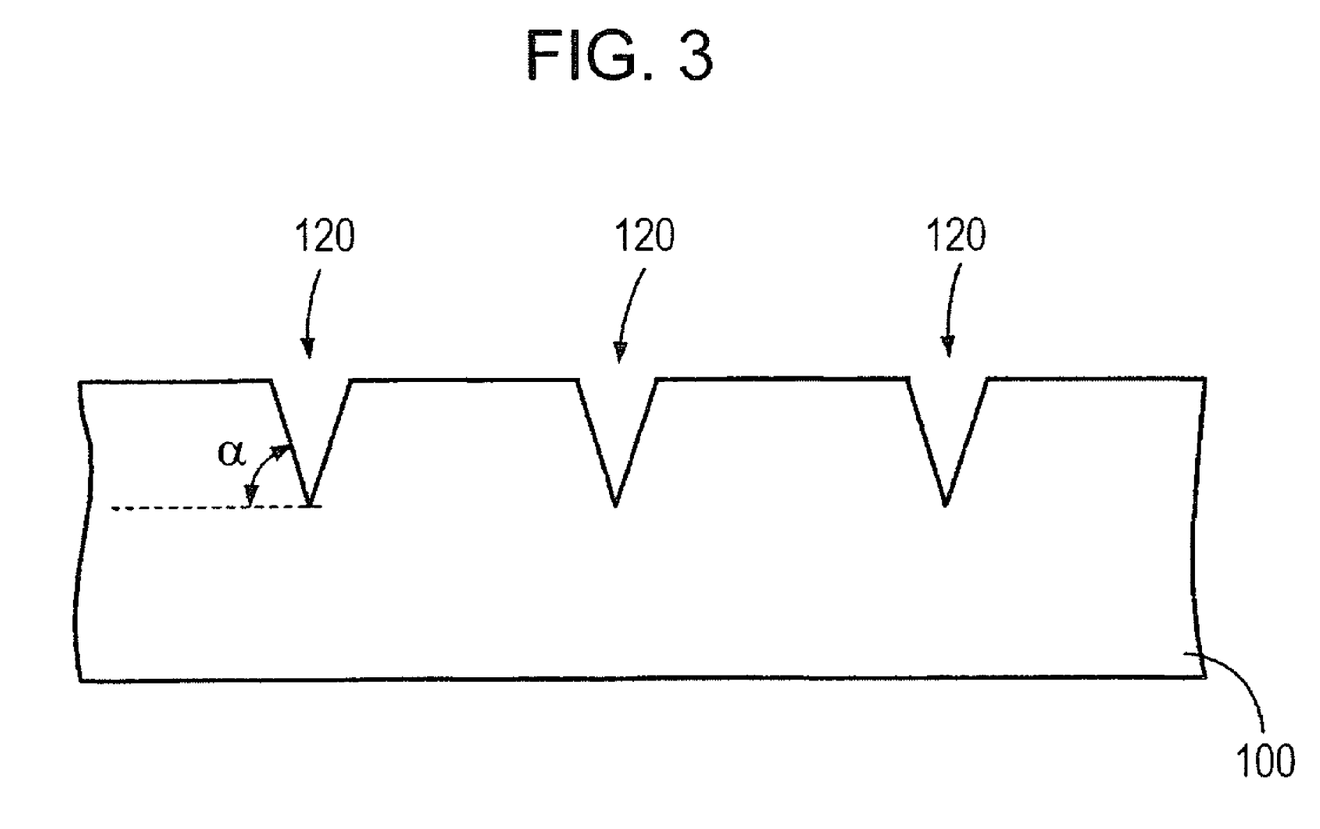
FIG. 3 is a sectional view showing a V-shaped trench structure.

However, when the taper angle α is made excessively acute while a narrow trench structure is maintained, a problem as shown in FIG. 3 occurs. FIG. 3 is a schematic sectional view of a principal portion, illustrating a V-shaped trench structure.

Specifically, when the taper angle α is made excessively acute, a V-shaped trench 120 is formed. Such a V-shaped trench 120 has the problem of decreasing the element withstand voltage.

Figure 4A:
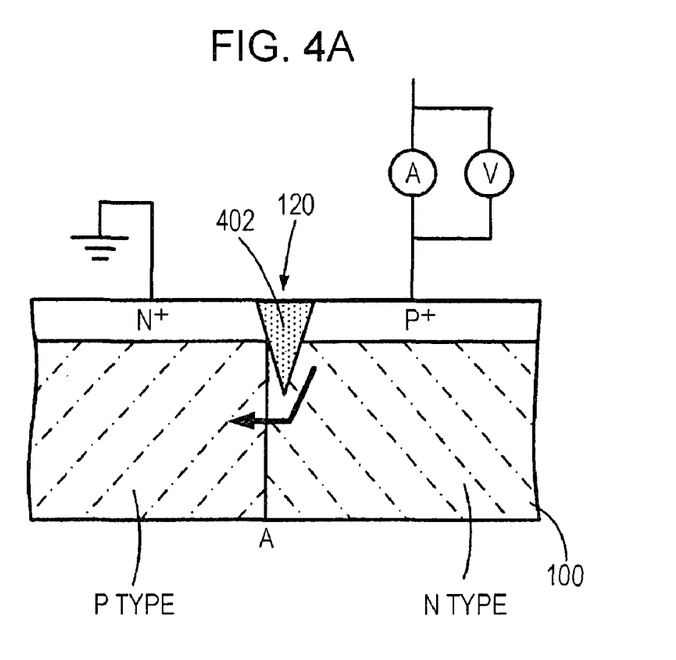
FIGS. 4A and 4B are views each illustrating the element withstand voltage of a semiconductor device provided with a V-shaped trench structure based on the position of the trench.
Figure 4B:
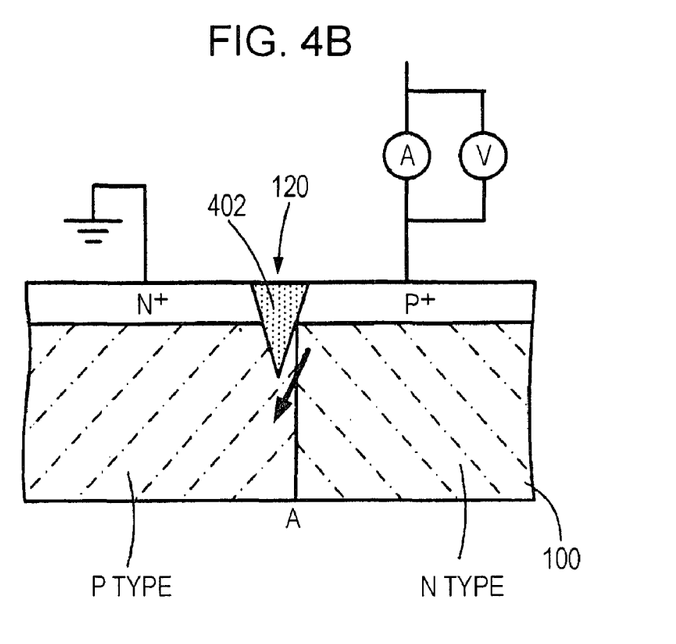

FIGS. 4A and 4B are schematic sectional views each showing a principal portion of a semiconductor device provided with a V-shaped trench structure. An oxide film 402 is formed in a V-shaped trench 120.

The positional margin at a boundary A between a PMOS region and an NMOS region is decreased due to the V-shape of the trench structure. When the positional margin is decreased, the boundary A may lie in the PMOS region side as shown in FIG. 4A or may lie in the NMOS region side as shown in FIG. 4B.

Therefore, as shown by arrows in FIGS. 4A and 4B, a current easily flows between elements, thereby significantly decrease the element withstand voltage.

Figure 5:
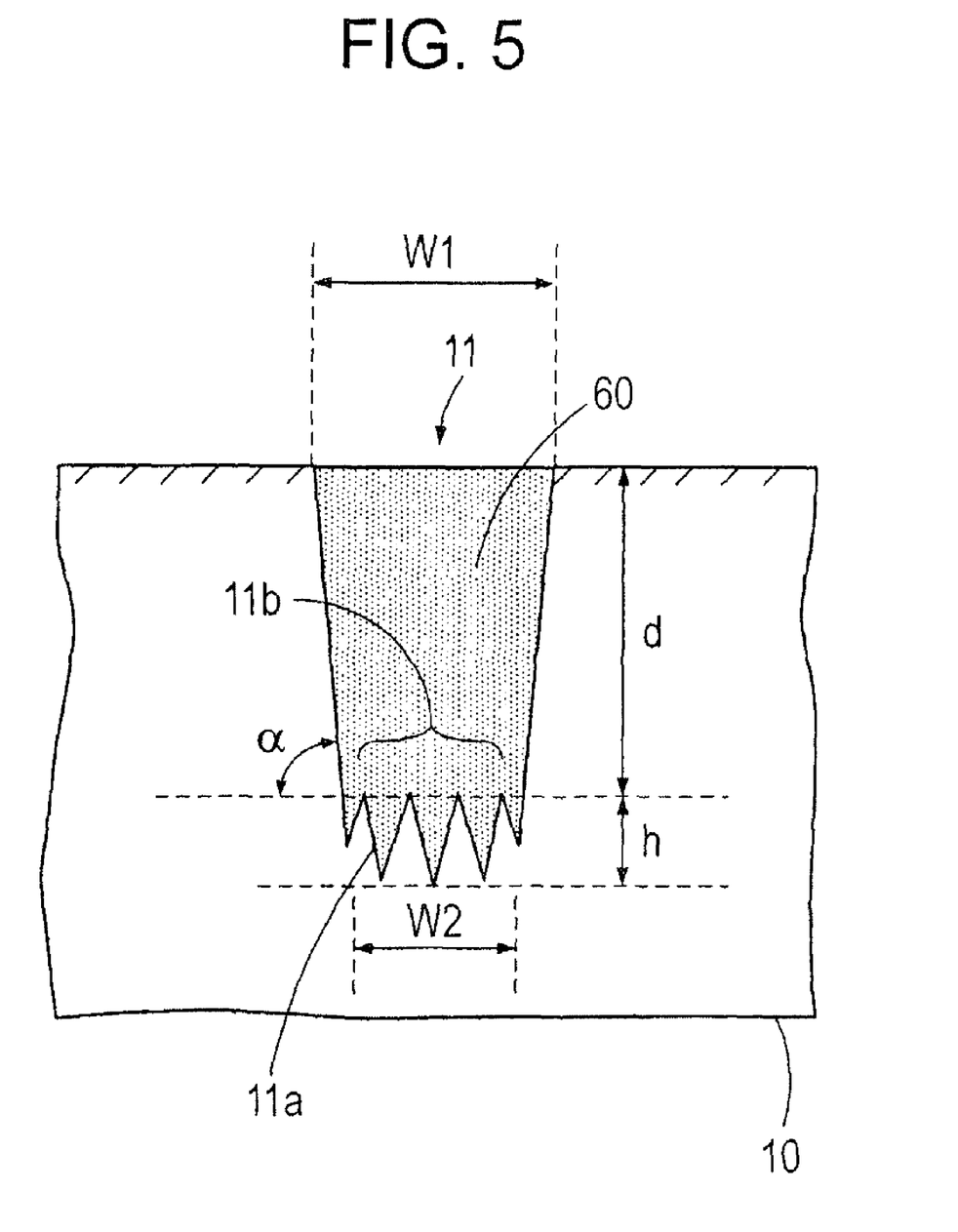
FIG. 5 is a sectional view of a trench formed in a semiconductor substrate according to an embodiment of the present invention.

FIG. 5 is a schematic sectional view of a principal portion of a trench structure formed in a semiconductor substrate. The trench 11 has a bottom 11a having unevenness (roughness). However, such unevenness is not formed in the upper surface of a semiconductor substrate 10 and in the side wall of the trench 11. Also, an oxide film 60 is formed in the trench 11. A thermal oxide film may be formed over the inner wall of the trench 11.

As illustrated in FIG. 5, the depth d of the trench 11 is the distance from the surface of the semiconductor substrate 10 to the top end of the unevenness. The opening width of the trench 11 is W1, and the width of the bottom 11a of the trench 11 is W2. Also, the height of the unevenness of the bottom 11a is h. Herein, h denotes a difference in height between a concave portion and a convex portion of the unevenness. In FIG. 5, the depth d of the trench 11 is, for example, 290 nm to 350 nm, the width W1 is, for example, 100 nm to 120 nm, and the width W2 is, for example, 45 nm to 55 nm.

The trench 11 is formed by dry-etching the semiconductor substrate 10. For example, the trench 11 having the bottom 11a with unevenness is formed by controlling at least one parameter of etching conditions. Examples of parameters include an etching gas flow rate ratio, an etching ambient pressure, an electric power applied to an electrode of an etching apparatus, and a substrate stage temperature.

The method of forming the trench 11 provided with unevenness is described in detail with reference to FIGS. 6A to 6H. In the method of manufacturing a semiconductor device, the trench 11 is formed by dry etching under reduced pressure.

For example, the flow rate of chlorine gas, oxygen gas, nitrogen gas, and argon gas, the electric power applied to an upper electrode, the voltage applied to a lower electrode of an etching apparatus, the pressure of the etching apparatus, or the substrate stage temperature is controlled to form unevenness 11b at the bottom 11a of the trench 11.

Figure 6A:
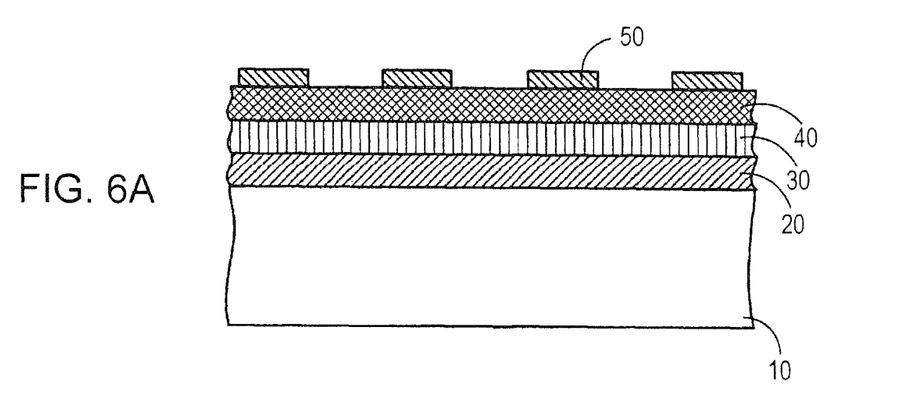
FIGS. 6A to 6H are sectional views showing a method of manufacturing a semiconductor device according to the embodiment of the present invention.
Figure 6B:
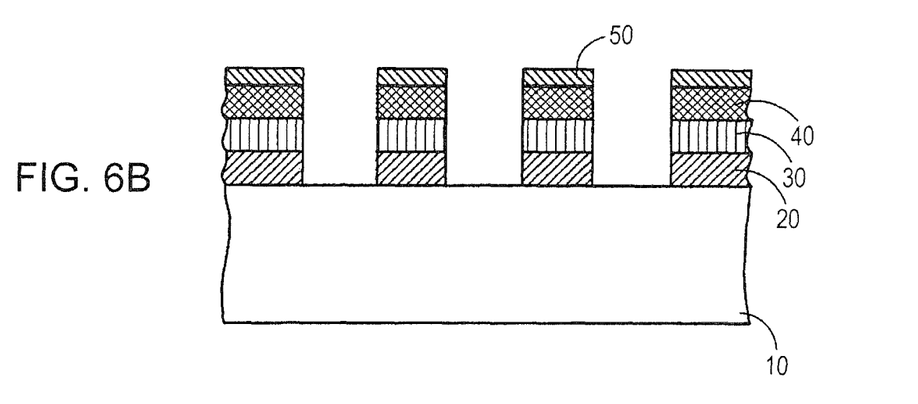
Figure 6C:
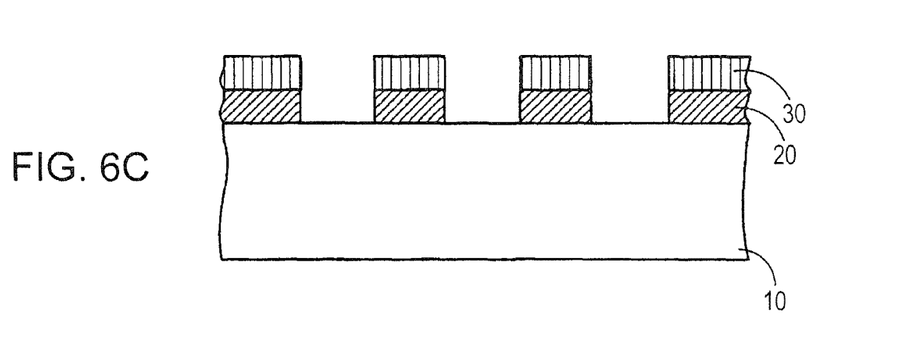

FIGS. 6A to 6C are schematic sectional views of a principal portion, showing respective steps for forming a mask pattern.

As shown in FIG. 6A, a silicon oxide film 20 is formed in a thickness of, for example, 10 nm over a semiconductor substrate 10 by a thermal oxidation method. The semiconductor substrate 10 is composed of silicon or gallium arsenide.

A silicon nitride film 30 is formed in a thickness of, for example, 100 nm over the silicon oxide film 20 by CVD. An antireflective film 40 is formed in a thickness of, for example, 100 nm by spin coating. Further, a photoresist film 50 is selectively disposed over the antireflection film 40 by photolithography. As the photoresist film 50, for example, an argon fluoride (ArF) resist is used. The thickness of the photoresist film 50 is, for example, 300 nm.

Then, as shown in FIG. 6B, the antireflection film 40, the silicon nitride film 30, and the silicon oxide film 20 are etched in order using the photoresist film 50 as a mask. After the etching, as shown in FIG. 6C, the antireflection film 40 and the photoresist film 50 are removed by ashing.

Figure 6D:
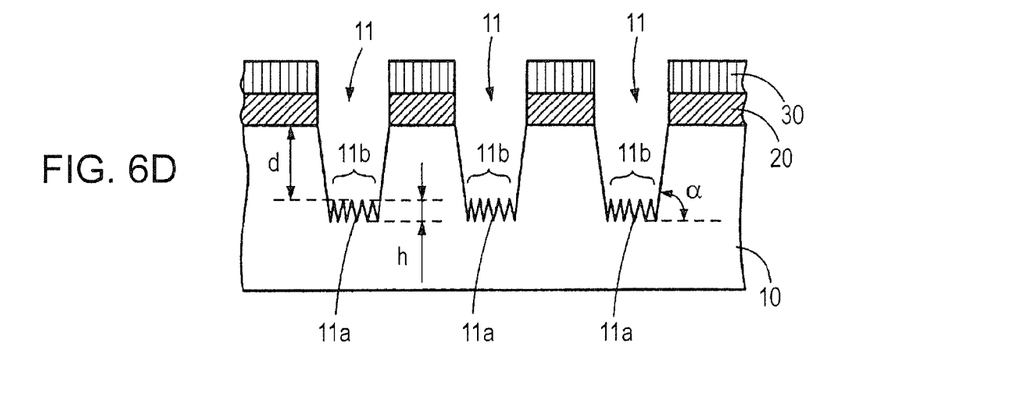
Figure 6E:
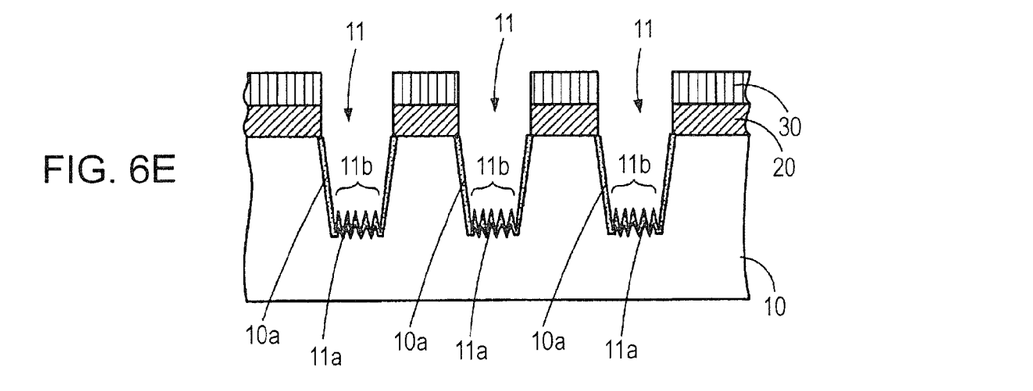
Figure 6F:
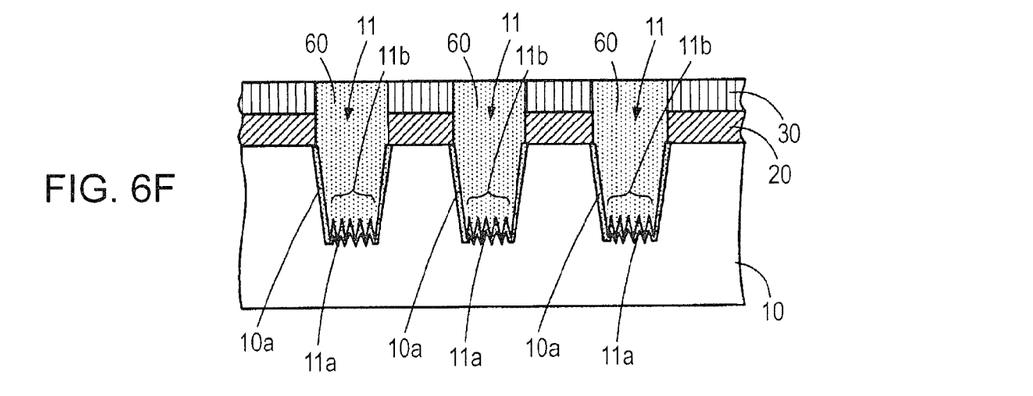

FIGS. 6D to 6F are sectional views showing respective etching and CMP steps.

As shown in FIG. 6D, the semiconductor substrate 10 is dry-etched in a dry etching apparatus using the silicon nitride film 30 as a mask.

The dry etching apparatus is provided with an inductively coupled plasma (ICP) type coiled electrode as an upper electrode, a high-frequency AC voltage being applied to the upper electrode. Further, a substrate stage is provided below the upper electrode, for mounting the semiconductor substrate thereon.

A DC voltage or AC voltage is applied to the substrate stage, and a bias potential is superposed thereon. Hereinafter, the substrate stage may be referred to as a "lower electrode" because a voltage is applied to the substrate stage. An etching process according to this embodiment may be obtained by an etching apparatus with a configuration other than the above as the dry etching apparatus.

An etching gas includes chlorine gas and oxygen gas. Chlorine gas is supplied at 100 sccm to the dry etching apparatus in order to etch the semiconductor substrate 10. Further, oxygen gas is supplied at 10 sccm in order to form a micromask composed of a reaction product containing a SiO bond on a surface to be etched.

The unevenness 11b is formed at the trench bottom 11a by etching using these two types of gases.

Further, in order to control the unevenness height h of the trench bottom, the etching gas may include nitrogen gas with chlorine gas and oxygen gas. The flow rate of nitrogen gas is set to, for example, 0 sccm to 30 sccm.

The ambient pressure of etching is set to, for example, 50 mTorr. For example, a high-frequency electric power of 1000 W is applied to the upper electrode, and a bias potential of, for example, −500 V, is applied to the lower electrode. Further, the treatment time is set to, for example, 30 sec, and the substrate stage temperature is set to, for example, 60° C.

In this etching treatment, first portions of the bottom 11a of the trench 11, excluding second portions covered by the micromask, are etched to form the unevenness at the bottom 11a.

Specifically, for example, the trenches 11 each having a trench depth d of 310 nm and the unevenness height h of several nm to several tens nm are formed in the semiconductor substrate 10. The width of each convex portion of the unevenness 11b is 30 nm or less.

The height h of the unevenness 11b can be controlled by etching conditions. Further, the taper angle α of the trenches 11, and the etching selection ratio between the semiconductor substrate 10 and the silicon nitride film 30 can also be controlled by the etching conditions.

As shown in FIG. 6E, in a step subsequent to the dry etching, a thermal oxide film 10a having a thickness of, for example, 3 nm is formed over the inner wall of each trench 11. As shown in FIG. 6F, an insulating film 60, for example silicon oxide film, is buried in each of the trenches 11.

Figure 6G:
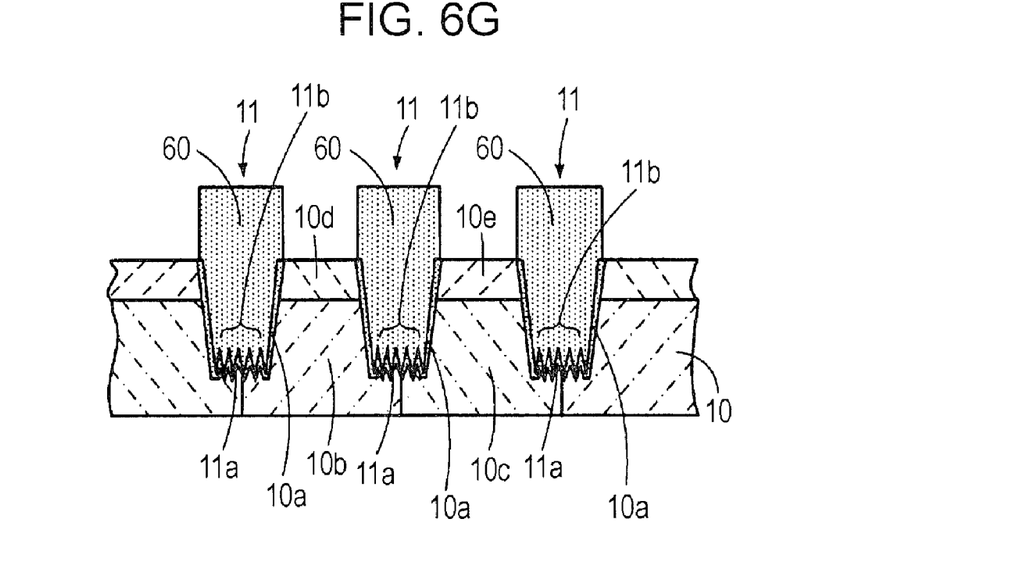

FIGS. 6G and 6H are sectional views of respective transistor forming steps. After the silicon nitride film 30 and the silicon oxide film 20 are removed, as shown in FIG. 6G, PMOS region 10b and NMOS region 10c are formed by well implantation in the semiconductor substrate 10. Then, channel regions 10d and 10e are formed.

Figure 6H:
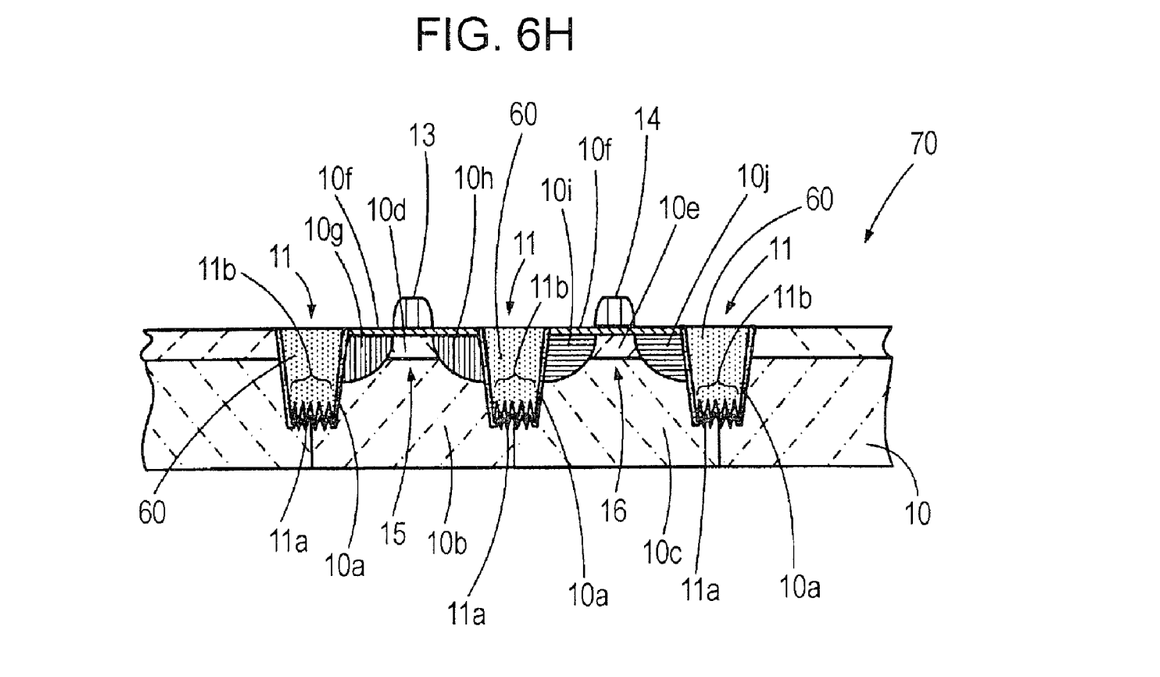

Then, as shown in FIG. 6H, a gate oxide film 10f is formed over each of the PMOS region 10b and the NMOS region 10c, and further gate electrodes 13 and 14 are formed. In addition, source and drain regions 10g, 10h, 10i, and 10j are formed over the semiconductor substrate 10 to form MOS transistors 15 and 16 over the semiconductor substrate 10.

An element isolation structure is adapted for isolating from each other p-type impurity regions and n-type impurity regions formed in the semiconductor substrate 10.

A description is made of how the height h of the unevenness 11b changes with changes in the nitrogen flow rate as an example of the etching conditions.

Figure 7:
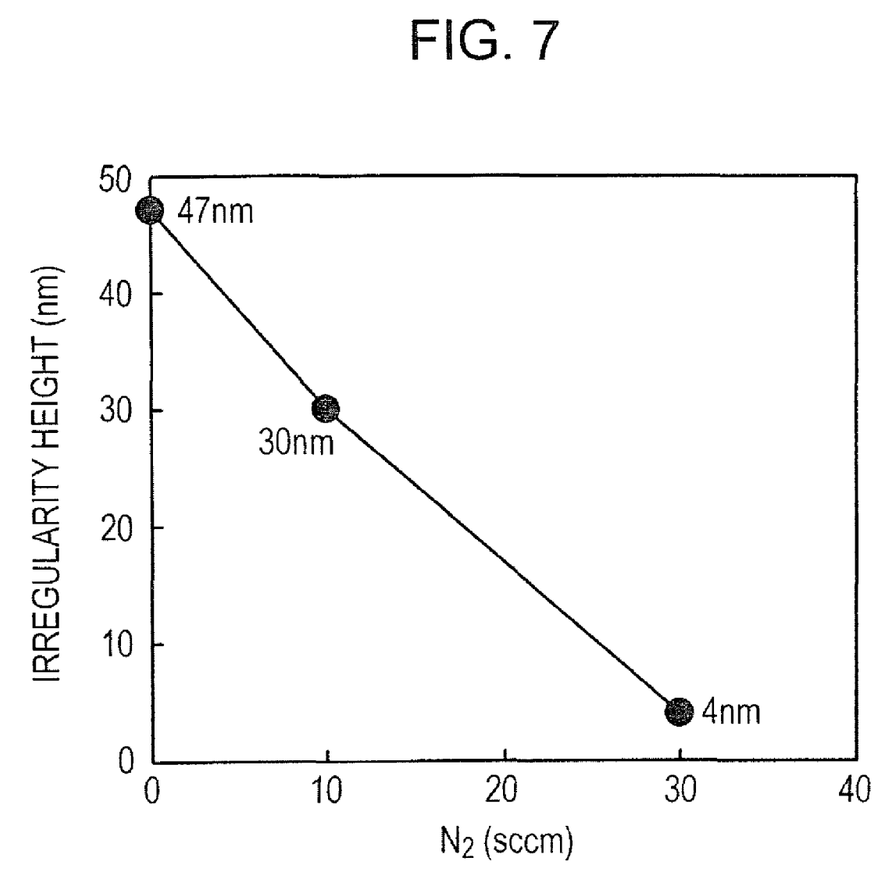
FIG. 7 is a graph showing a relation between the height of unevenness and nitrogen flow rate.

FIG. 7 is a graph showing a relation between the unevenness height and the nitrogen flow rate in an etching step. The nitrogen flow rate (sccm) is shown as abscissa, and the height h (nm) of the unevenness 11b is shown as ordinate.

The height h of the unevenness 11b can be controlled in the range of 4 nm to 47 nm by controlling the flow rate of nitrogen gas in the etching gases. When the thermal oxide film 10a is formed over the inner wall of each of the trenches 11 after forming the trenches, the lower limit of the height h of the unevenness 11b is controlled to be greater than the thickness of the thermal oxide films 10a.

For example, when the thermal oxide films 10a of 3 nm in thickness are formed, the nitrogen flow rate in etching is controlled to 30 sccm or less so that the height h of the unevenness is controlled to 4 nm or more. This control can prevent the unevenness 11b from disappearing by the thermal oxide films 10a even when the thermal oxide film 10a is formed over the inner wall of each of the trenches 11. Further, when unevenness is formed in the sidewalls of the trenches 11, the height of unevenness in the sidewalls is lower than that of unevenness formed at the bottoms, and is a half or less of the thickness of the thermal oxide films 10a.

A description is made of how the taper angle α and the selection ratio between the semiconductor substrate 10 and the silicon nitride film 30 changes with changes in the nitrogen flow rate in the etching treatment shown in FIG. 6D.

Figure 8:
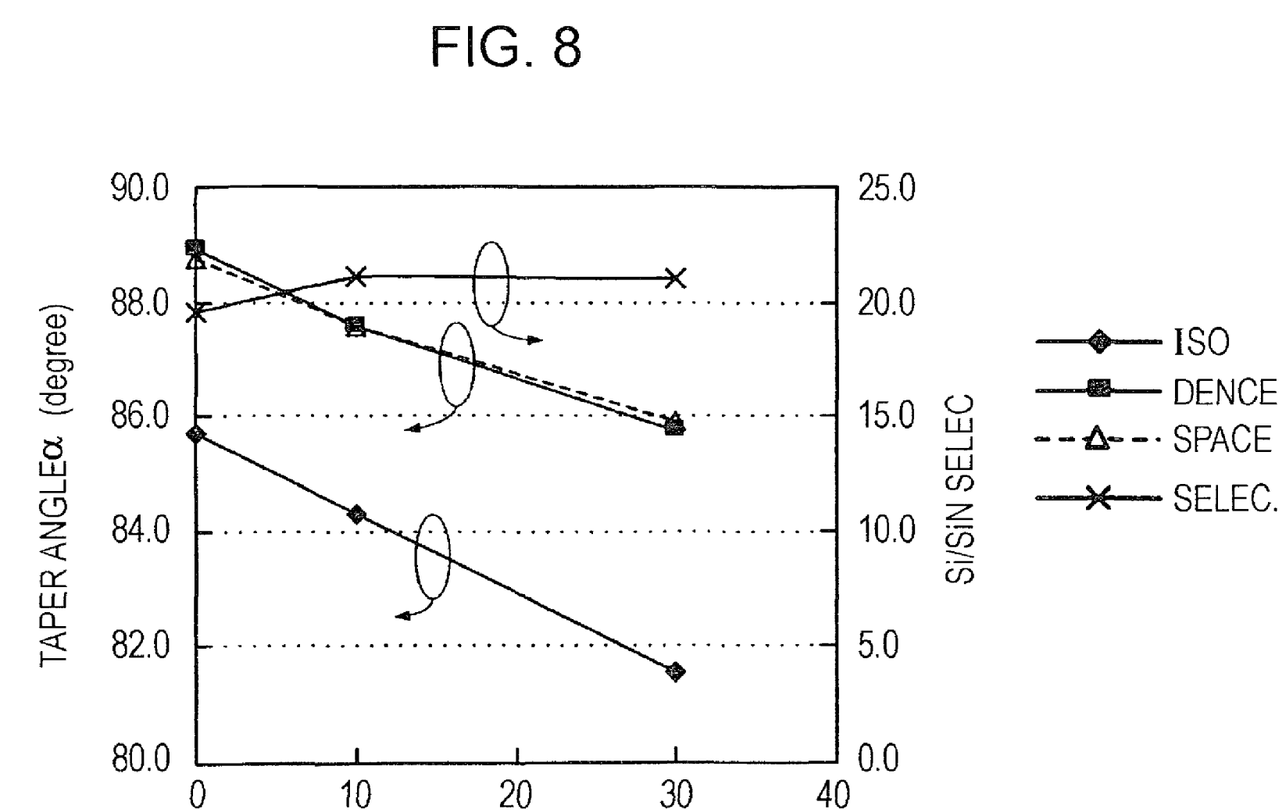
FIG. 8 is a graph showing a relation between the taper angle, selection ratio, and nitrogen flow rate.

FIG. 8 is a graph showing the nitrogen flow rate dependency of the taper angle and selection ratio. In this figure, the nitrogen flow rate (sccm) is shown in the abscissa, the taper angle (degree) is shown in the left ordinate, and the etching election ratio between the semiconductor substrate 10 and the silicon nitride film 30 is shown in the right ordinate.

By controlling the flow rate of nitrogen in the etching gases, the taper angle α of the trenches 11 can be controlled in the range of 80° to 90°.

Also, the selection ratio between the semiconductor substrate 10 and the silicon nitride film 30 can be controlled by controlling the nitrogen flow rate. The taper angle α of a trench having a flat bottom is about 80°.

Figure 9:
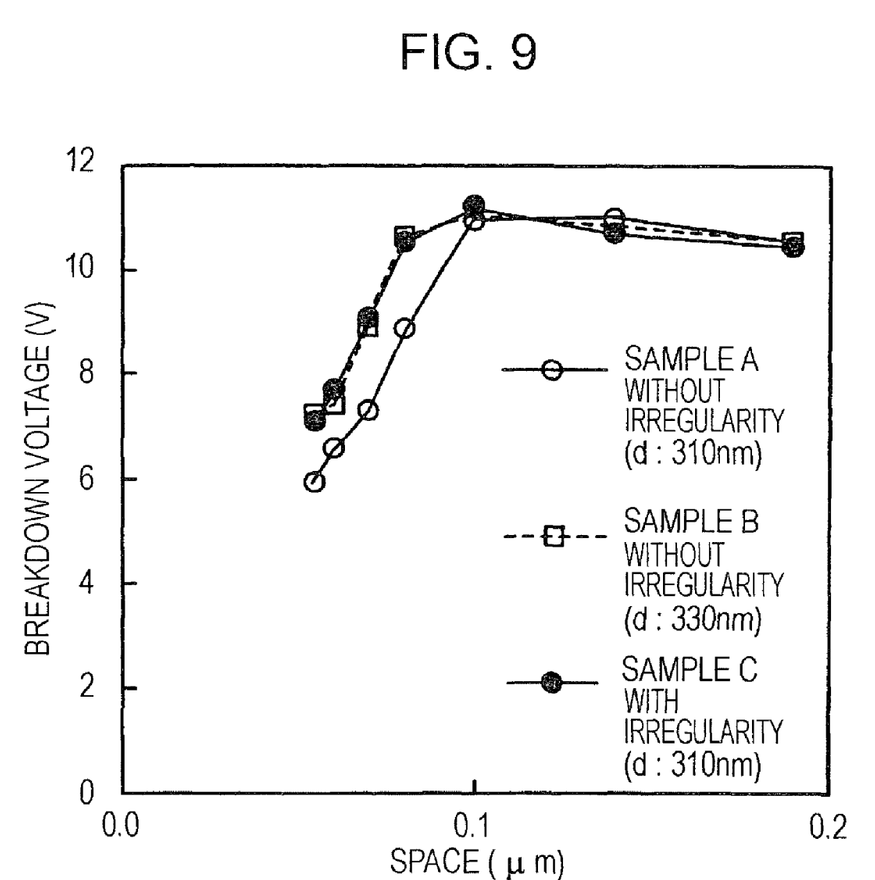
FIG. 9 is a graph showing a relation between element withstand voltage and trench width.

FIG. 9 is a graph showing the trench width dependency of the element withstand voltage. In this figure, the trench widths (μm) of three samples A, B, and C are shown in the abscissa, and the breakdown voltage (V) corresponding to the element withstand voltage is shown in the ordinate.

The sample A has a trench depth d of 310 nm and no unevenness at the bottom of a trench. The sample B has a trench depth d of 330 nm and no unevenness at the bottom of a trench. The sample C has a trench depth d of 310 nm and unevenness having a height h of 20 nm at the bottom of a trench.

In a comparison between the samples A and C, the breakdown voltage of the sample C having unevenness with a height of 20 nm at the bottom of a trench more increases than the sample A without unevenness while both samples have a trench depth d of 310 nm. In particular, this difference becomes significant in a narrower trench of 0.1 μm or less in width.

In a comparison between the samples C and B, the samples C and B have the same breakdown voltage with any one of the trench widths while the trench depth d of the sample C is less than that of the sample B.

When the bottom 11a of each trench 11 is provided with the unevenness 11b with height h, bottom-up can be made by h at the depth d of the trench 11. Therefore, the breakdown voltage can be increased by forming the unevenness 11b at the bottom 11a of each of the trenches 11.

The results shown in FIGS. 7 and 8 are based on only the nitrogen flow rate as a condition parameter of etching. However, in this embodiment, a condition parameter is not limited to the nitrogen flow rate. Namely, the semiconductor substrate 10 having the trenches 11 each provided with the unevenness 11b at the bottom 11a thereof can be formed by controlling at least one of the flow rate of chlorine gas and oxygen gas and argon gas in the treatment gases, the electric power applied to the upper electrode and the voltage applied to the lower electrode in the dry etching apparatus, the ambient pressure, and the substrate stage temperature.

Specifically, for example, chlorine gas at 100 sccm, oxygen gas at 10 sccm, and nitrogen gas at 10 sccm are introduced into the dry etching apparatus, and the total pressure of the atmospheric gas is set to, for example, 50 mTorr. Further, a high-frequency power of 1000 W is applied, a bias potential of −500 V is applied to the lower electrode, and the substrate stage temperature is set to 60° C. These conditions are regarded as basic conditions.

On the basis of the basic conditions, at least one condition parameter is controlled within a predetermined range.

Specifically, chlorine gas at 100 sccm to 200 sccm, oxygen gas at 5 sccm to 30 sccm, and nitrogen gas at 0 sccm to 30 sccm are introduced into the dry etching apparatus, and further argon gas, as a rare gas, is introduced into these gases in the range of 0 sccm to 100 sccm. The total ambient pressure is set to 20 mTorr to 50 mTorr. In addition, the high-frequency power is set to 500 W to 1200 W, the lower electrode is set to −600 V to −200 V, and the substrate stage temperature is set in the range of 15° C. to 80° C. The dry etching is performed for a predetermined treatment time.

Figure 10A:
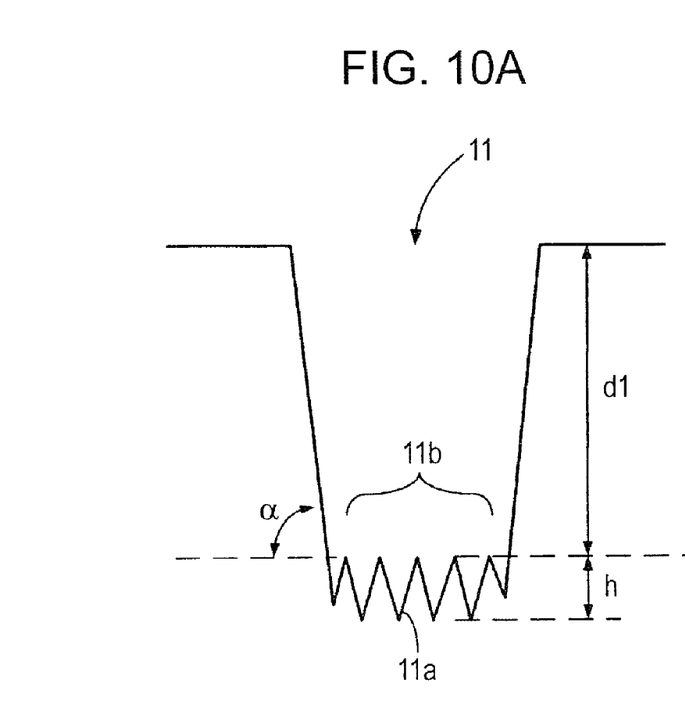
FIGS. 10A and 10B are sectional views showing a comparison between different trench structures.
Figure 10B:
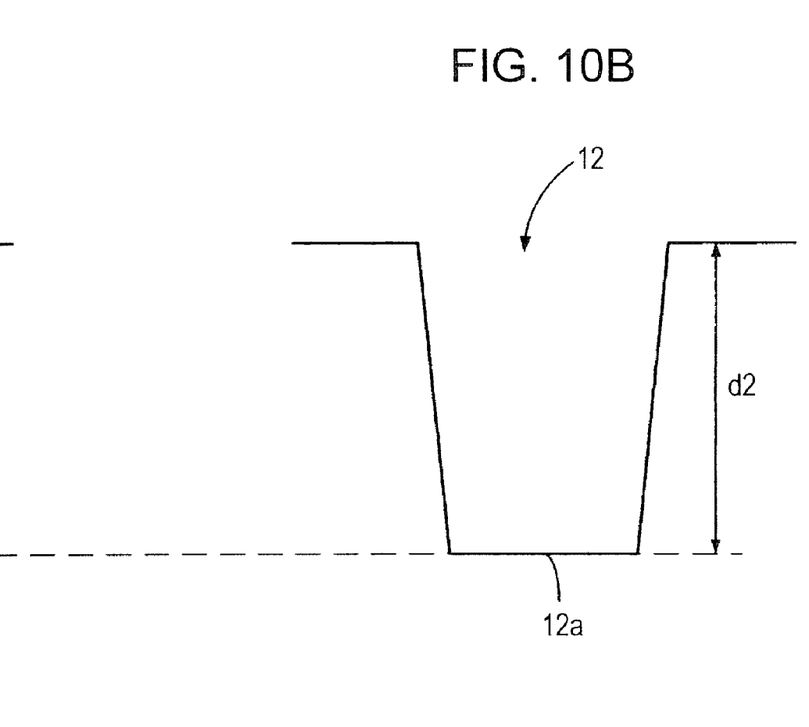

FIGS. 10A and 10B are schematic views illustrating a comparison between trench structures. FIG. 10A shows a trench 11 having unevenness 11b at the bottom 11a thereof, and FIG. 10B shows a trench 12 having a flat bottom 12a.

As shown in FIG. 10A, the depth of the trench can be substantially increased by forming the unevenness 11b at the bottom 11a of the trench 11. For example, when the unevenness 11b with high h is formed at the bottom 11a of the trench 11, the depth d of the trench 11 can be substantially increased by the height h as compared with the trench shown in FIG. 10B. Namely, the substantial depth of the trench 11 is d1+h. As a result, in a semiconductor device including the trench 11 shown in FIG. 10A, the element withstand voltage is increased as compared with a semiconductor device including the trench 12 shown in FIG. 10B.

Since the element withstand voltage of a semiconductor device including the trench 11 shown in FIG. 10A is increased as compared with a semiconductor device including the trench 12 shown in FIG. 10B, a comparison between the two semiconductor devices with the same withstand voltage indicates that the depth d1 of the trench 11 shown in FIG. 10A is shallower by the height h of the unevenness 11b than the depth d2 of the trench 12 shown in FIG. 10B.

Therefore, in a comparison between the two semiconductor devices with the same withstand voltage, the aspect ratio of the trench 11 shown in FIG. 10A can be decreased relative to the trench 12 shown in FIG. 10B. Consequently, an oxide film can be easily buried in the trench structure shown in FIG. 10A.

In the trench 11 shown in FIG. 10A, an oxide film can be easily buried in the trench 11, and the taper angle α is brought closer to a right angle.

Therefore, a semiconductor device including the trench 11 shown in FIG. 10A has the bottom 11a having a sufficient area and causes no positional deviation as described with reference to FIGS. 4A and 4B. Further, an oxide film can be easily buried in the trench 11.

In the process of forming the trench 11 shown in FIG. 10A, as described above, a trench 11 having a small aspect ratio may be formed. Therefore, the etching selection ratio of the silicon nitride film 30 to the semiconductor substrate 10 can be decreased. As a result, readhesion of silicon nitride produced in etching to the semiconductor substrate 10 can be suppressed. In other words, the method of manufacturing a semiconductor device according to this embodiment can manufacture a semiconductor device in which defects over the substrate due to the silicon nitride are decreased to improve the quality.

Figure 11A:
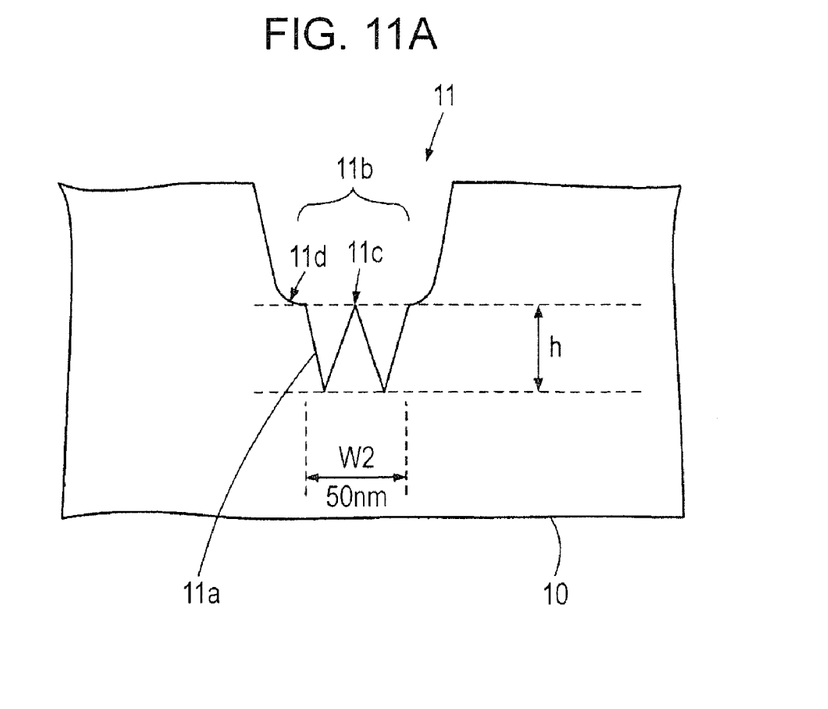
FIGS. 11A and 11B are sectional views each showing a trench bottom.
Figure 11B:
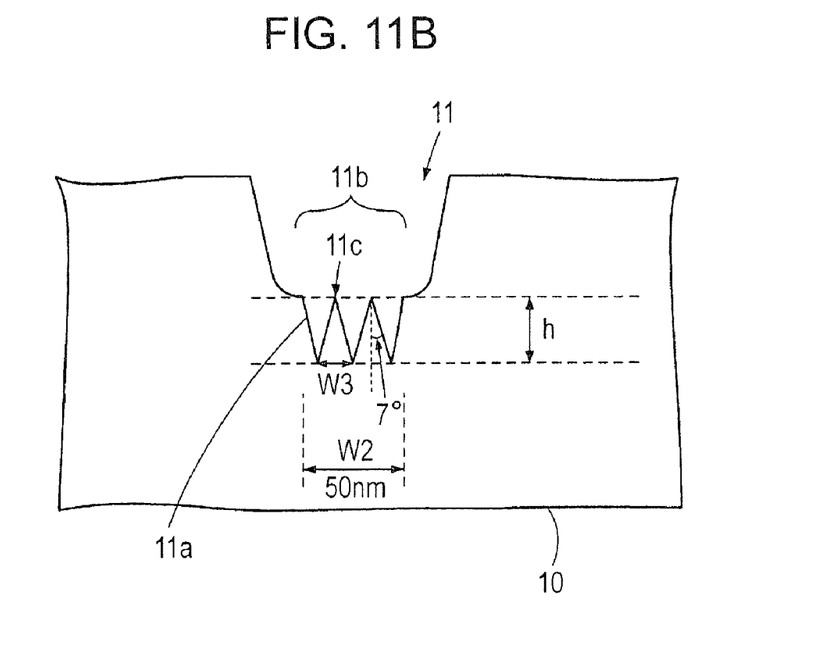

The height h of the unevenness 11b is preferably 30% or less of the depth d of the trench 11. FIGS. 11A and 11B are enlarged views each showing a trench bottom. In both FIGS. 11A and 11B, unevenness 11b is formed at the bottom 11a of a trench 11. Also, the bottom 11d of the side of the trench 11 is slightly arcuate, and the width of the bottom 11a excluding the bottom 11d corresponds to the above-described width w2.

In order to form substantially uniform unevenness 11b at the bottom 11a of the trench 11 and achieve sufficient element withstand voltage, it is necessary to form at least two convex portions at the bottom 11a.

For example, as shown in FIG. 11A, a trench 11 having one convex portion 11c has a so-called sub-trench structure at the bottom 11a thereof. When such a sub-trench structure is formed in the trench 11, an electric field is concentrated in the sub-trench. Therefore, it is necessary to form at least two convex portions 11c at the bottom 11a of the trench 11 as shown in FIG. 11B.

In this case, if the section angle of the tip of the convex portion 11c is, for example, 140 (70×2), the width W3 of the bottom of the convex portion 11c is as follows:

$$2 \times h \times \tan(7°) \quad (1)$$

A value obtained by dividing the width W2 of the bottom 11a of the trench 11 by the equation (1), i.e., the width W3, corresponds to the number of convex portions 11c. The number of convex portions 11c is represented by the following:

$$50 \div (2 \times h \times \tan(7°)) \quad (2)$$

Since at least two convex portions 11c are required, the following inequality is established:

$$50 \div (2 \times h \times \tan(7°)) \geq 2 \quad (2)$$

This is solved to obtain $h \leq 101$ nm.

As described above with reference to FIG. 5, since the depth d of the trench 11 is 320 nm, the height h of unevenness is about 32% or less of the depth d of the trench 11. Namely, when the height h of the unevenness 11b is 30% or less of the depth d of the trench 11, the trench having at least two convex portions 11c can be provided in the semiconductor substrate 10.

Further, when the height h of the unevenness 11b is 15% or less of the depth d of the trench 11, a leakage current between elements is significantly decreased. Therefore, the height h of the unevenness 11b at the bottom 11a of the trench 11 is more preferably 15% or less of the depth d of the trench 11.

The above-described values of d, h, W1, W2, and W3 are only examples, and, in the embodiment, d, h, W1, W2, and W3 are not limited to these values.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device comprising:
    forming a mask pattern over a semiconductor substrate;
    forming a trench having first unevenness in the semiconductor substrate by etching using the mask pattern;
    burying an insulator in the trench;
    forming a first well having a first conductivity type in the semiconductor substrate,
    forming a first transistor in the first well,
    forming a second well having a second conductivity type different from the first conductivity type in the semiconductor substrate,
    forming a second transistor in the second well,
    wherein a bottom of the trench includes a plurality of convex portions extending from the bottom of the trench toward a top of the trench
    wherein the trench is located between the first well and the second well,
    wherein the first unevenness includes a plurality of projections having a different height downward.

2. The method according to claim 1, wherein a first difference in height of the first unevenness is greater than a second difference in height of second unevenness formed in a side wall of the trench.

3. The method according to claim 2, wherein the first difference in height is 30% or less of a depth of the trench.

4. The method according to claim 3, wherein the first difference in height is 4 nm or more.

5. The method according to claim 2, wherein the etching is performed using a mixed gas containing chlorine gas and oxygen gas.

6. The method according to claim 5, wherein the mixed gas further contains a nitrogen gas or a rare gas.

7. The method according to claim 2, further comprising forming a thermal oxide film over the side wall of the trench before burying the insulator in the trench.

8. The method according to claim 7, wherein a thickness of the thermal oxide film is less than the first difference in height.

9. The method according to claim 7, wherein the second difference in height is a half or less of a thickness of the thermal oxide film.

10. The method according to claim 1, wherein the etching to form the trench is performed using a mixed gas containing chlorine gas, oxygen gas and nitrogen gas.

11. The method according to claim 1, wherein the trench has a taper angle with respect to a surface of the semiconductor substrate and the taper angle is adjusted by controlling a flow rate of nitrogen in an etching gas.

12. The method according to claim 1, wherein the trench has a taper angle with respect to a surface of the semiconductor substrate and the taper angle is 80.degree. to 90.degree.

13. A method of manufacturing a semiconductor device comprising:
    forming a mask pattern over a semiconductor substrate;
    forming a trench having first unevenness in the semiconductor substrate by etching using the mask pattern, the trench having a taper angle with respect to a surface of the semiconductor substrate;
    burying an insulator in the trench;
    forming a first well having a first conductivity type in the semiconductor substrate,
    forming a first transistor in the first well,
    forming a second well having a second conductivity type different from the first conductivity type in the semiconductor substrate, forming a second transistor in the second well,
wherein a bottom of the trench includes a plurality of convex portions extending from the bottom of the trench toward a top of the trench
wherein the trench is located between the first well and the second well,
wherein the taper angle is adjusted by controlling a flow rate of nitrogen in an etching gas.

14. The method according to claim 13, wherein the first unevenness includes a plurality of projections having a different height downward.

* * * * *